(12) United States Patent
Ellis et al.

(10) Patent No.: US 7,352,070 B2
(45) Date of Patent: Apr. 1, 2008

(54) POLYMER ENCAPSULATED ELECTRICAL DEVICES

(75) Inventors: Thomas S. Ellis, Romeo, MI (US); Glen E. Novak, Romeo, MI (US); Bruce A. Myers, Kokomo, IN (US); Scott D. Brandenburg, Kokomo, IN (US); Jeenhuei S. Tsai, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/608,702

(22) Filed: Jun. 27, 2003

(65) Prior Publication Data

US 2004/0262782 A1     Dec. 30, 2004

(51) Int. Cl.
*H01L 23/29* (2006.01)
(52) U.S. Cl. ............... 257/789; 257/778; 257/E31.117; 257/E51.02; 257/E23.116; 257/E23.121; 257/E23.124; 257/E23.125
(58) Field of Classification Search ................ 257/787, 257/788, 789, 791, 795, 778, 737–738, 685, 257/723, 731, 733, E31.117, E51.02, E23.116, 257/E23.121, E23.124, E23.125, E23.021, 257/E23.069
See application file for complete search history.

(56) References Cited

U.S. PATENT DOCUMENTS

| | | | |
|---|---|---|---|
| 5,153,657 A * | 10/1992 | Yu et al. ..................... 399/350 |
| 5,381,599 A | 1/1995 | Hall | |
| 6,005,466 A * | 12/1999 | Pedder ....................... 336/200 |
| 6,081,023 A * | 6/2000 | Murakami et al. .......... 257/666 |
| 6,083,774 A | 7/2000 | Shiobara et al. | |
| 6,099,783 A | 8/2000 | Scranton et al. | |
| 6,143,214 A | 11/2000 | Barlow | |
| 6,257,215 B1 * | 7/2001 | Kaminaga et al. .......... 123/647 |
| 6,335,571 B1 * | 1/2002 | Capote et al. ............. 257/787 |
| 6,593,404 B1 * | 7/2003 | Shin et al. ................. 524/140 |
| 6,614,108 B1 | 9/2003 | Sanftleben et al. | |
| 2003/0100654 A1 * | 5/2003 | Chheang et al. ............ 524/445 |
| 2003/0218258 A1 * | 11/2003 | Charles et al. ............. 257/783 |
| 2004/0084758 A1 * | 5/2004 | Chuang et al. ............. 257/673 |
| 2004/0191503 A1 * | 9/2004 | Matayabas et al. ......... 428/331 |

* cited by examiner

*Primary Examiner*—Hoai v Pham
*Assistant Examiner*—DiLinh Nguyen
(74) *Attorney, Agent, or Firm*—Jimmy L. Funke

(57) ABSTRACT

Improved encapsulated, overmolded and/or underfilled electrical components having a complete encapsulation, overmolding and/or underfilling with a coefficient of thermal expansion that is uniform and substantially free of gradients includes a polymeric matrix and an inorganic filler having a platelet geometric structure. The platelet structure of the filler allows a desirable coefficient of thermal expansion to be achieved using a very low level of filler material. This low level of filler material facilitates lower viscosity during forming of the encapsulation and/or overmolding, thereby facilitating complete filling of a mold cavity and underfilling of space between a circuit board and a semi-conductor chip electrically connected to the circuit board. In addition, the low viscosity has processing advantages that reduce the potential for damage to electrical components during encapsulation, overmolding and/or underfilling.

11 Claims, 1 Drawing Sheet

POLYMER ENCAPSULATED ELECTRICAL DEVICES

TECHNICAL FIELD

This invention relates to encapsulated, overmolded and/or underfilled electronic and/or other electrical components for protection of electrical function from thermal cycling, environmental exposure and/or mechanical impact.

BACKGROUND OF THE INVENTION

Printed circuit boards and other electrical and/or electronic devices and/or components are often encapsulated, overmolded and/or underfilled with a polymeric material to provide protection against thermal cycling, moisture and/or mechanical impact. Encapsulation is typically achieved by employing a transfer molding process to encase the electrical device in a thermoset body. During the process, the polymeric material must be in a liquid state to allow it to flow around and under various components, and subsequently solidify by cross-linking. In order to allow the polymeric material to flow around and completely encapsulate the components without damaging fragile wiring and interconnections frequently used in electronic devices, the polymeric material must have a relatively low viscosity (e.g., typically less than 200 poise).

Epoxy resin systems have been most frequently employed for encapsulating, overmolding and/or underfilling electronic devices such as printed circuit boards. There are several well-recognized disadvantages with the use of these conventional epoxy resin transfer molding processes. First, care must be taken to properly monitor and store the epoxy resins to prevent an increase in viscosity that could cause excessive forces to be exerted on fine wiring and other fragile interconnections resulting in destruction and scrapping of the electronic component. Another problem is that conventional resin transfer molding processes involve slow curing to prevent a rapid increase in viscosity as the resin flows around the component, which could result in destruction of the component due to excessive forces being exerted on the fragile wiring and interconnections. As a result of the slow cure rates and long cure times that are typically employed in the known resin transfer molding processes, cycle times are long and production rates are low. Other disadvantages with epoxy transfer molding include the potential for moisture absorption problems and destruction of electronic components due to thermal stresses resulting from the relatively high temperatures and long cure times required.

It has been proposed to overcome many of the disadvantages of resin transfer molding techniques for encapsulating and/or overmolding by employing reaction injection molding (RIM) techniques. RIM processes employ high-pressure impingement mixing and polymerization of two or more different liquids in a closed mold. The chemicals in the different liquids react to form a solid polymeric product. U.S. Pat. No. 6,143,214 discloses the use of a RIM process utilizing a cross-linked RIM system comprising tert-butyl-styrene monomer, divinyl benzene cross-linker, butyl lithium initiator, and 80 percent by weight silica fillers. The process overcomes various problems associated with resin molding transfer processes. Because there is not any reaction until the liquid streams are mixed, storage problems and damage of electronic components due to excessive viscosity may be eliminated. Further, reaction times are very significantly reduced resulting in higher productivity and reduced cost.

However, a problem with both the known RIM and resin transfer molding processes is that the low viscosity employed during the time in which the resin flows around the electronic components allows settling of the inorganic fillers (e.g., silica, glass, etc.) that are generally used to match the coefficient of thermal expansion (CTE) of the encapsulating material to that of the materials used to make the electronic components (e.g., metal oxides and other semi-conductor materials). This settling can result in a significant difference in the CTE at different locations within the encapsulating material, which may be detrimental to the reliability of an electronic component (e.g., a semi-conductor device) that is exposed to significant temperature variations during use or storage.

Another problem with both the known RIM and resin transfer molding processes is that relatively high filler loadings are required. In order to achieve a desirable CTE, the encapsulating resin typically contains from about 80 percent to about 90 percent silica (or comparable inorganic filler) by weight. This high filler level has a deleterious effect on the rheology of the encapsulating material. Specifically, the high filler loading can cause an increase in viscosity that prevents the resin from completely flowing around and completely encapsulating or overmolding the component. The increase in viscosity due to the high filler loading needed to achieve a desirable CTE and provide improved component reliability can also lead to destruction of the component during encapsulation due to excessive forces being exerted on fine wires and/or inner connections during flow of the encapsulating material.

Thus, there is a need for improved encapsulated, overmolded, and/or underfilled electrical components in which desirable rheology allows complete encapsulation, overmolding, and/or underfilling, and wherein the solidified encapsulating and/or overmolding composite material has a desirable CTE and a uniform CTE (i.e., substantially free of a CTE gradient).

Another problem with conventional thermoset encapsulating materials used to protect electronic components is that the thermoset materials are generally expensive, difficult to process, and brittle. As a result, thermoset encapsulated components are expensive and are not as well protected against shock and/or impact as may be desired. Thus, there is also a need for improved encapsulated, overmolded, and/or underfilled electrical components in which the encapsulating material is less expensive, easier to process, and tougher than the thermoset resins that have typically been employed.

SUMMARY OF THE INVENTION

It has been discovered that problems associated with the use of conventional resin transfer molding and reaction injection molding processes for encapsulating, overmolding and/or underfilling of electrical components may be overcome by employing a polymeric composite including a synthetic resin matrix and filler particles having a platelet structure substantially uniformly distributed in the matrix. In particular, it has been discovered that filler particles having a platelet structure and dimensions in the nanoscale range of from about 1 to about 700 nm may be employed at much lower levels than conventional particulate fillers to achieve a desired coefficient of thermal expansion. The lower levels of filler material facilitate preparation of encapsulating, overmolding and/or underfilling materials that have a lower viscosity during the early stages of the molding process (e.g., resin transfer molding or reaction injection molding) when the encapsulating material is in a liquid state and flows along surfaces of the electrical component. Optionally, conventional filler particles may be employed in combination with the particles having a platelet structure. As a result, a desired coefficient of thermal expansion may be achieved with lower filler loading and reduced potential for destruction of the electronic component due to the lower viscosity and lower shear forces being exerted on various fragile features of the electrical component such as fine wiring or interconnections thereby allowing complete underfilling without risk of destroying the component. The platelet structure and dimensions of the filler particles may also result in reduced settling and/or more uniform coefficient of thermal expansion throughout the encapsulating, overmolding and/or underfilling material after solidification or curing, whereby encapsulated, overmolded and/or underfilled electrical components exhibiting improved reliability may be prepared.

It has also been discovered that thermoplastic polymer materials (e.g., polyamides and/or polyesters) may be used in an injection molding process (e.g., RIM) to encapsulate, overmold and/or underfill electrical components such as electronic circuit board assemblies. The resulting thermoplastic encapsulated or overmolded electrical components may be manufactured more economically than is the case for conventional resin transfer processes and reaction injection molding processes that employ thermosettable (cross-linkable) resin systems due to the lower cost of thermoplastic materials and greater ease of processing of thermoplastic polymers. Further, the thermoplastic encapsulation and overmoldings are tougher and therefore provide better protection against shock and impact than the conventional thermoset encapsulations and overmoldings.

These and other features, advantages and objects of the present invention will be further understood and appreciated by those skilled in the art by reference to the following specification, claims and appended drawings.

DESCRIPTION OF THE PREFERRED EMBODIMENTS

Figure 1:
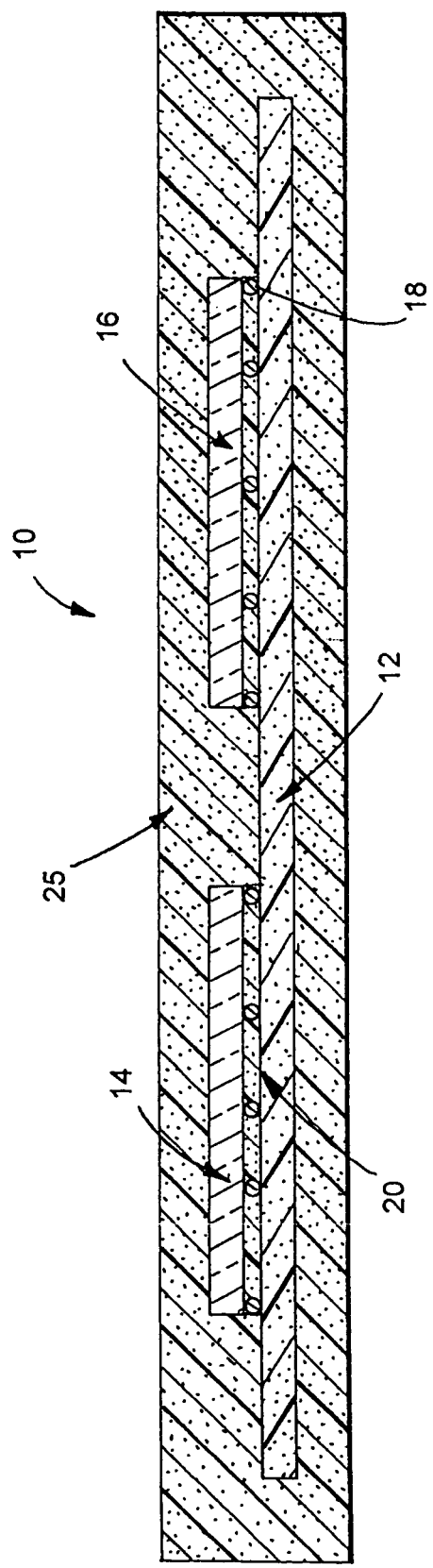
FIG. 1 is a schematic cross section of a polymer overmolded or encapsulated electronic circuit board in accordance with the invention.

As used herein, the expression "encapsulate" means to completely surround or encase the component in a polymer material, with the only discontinuities in the encasement or encapsulation being for electrical leads. The term "overmolding" is meant to refer to an arrangement in which the protective polymer material together with a substrate (e.g., a circuit board) completely encases a subcomponent (e.g., an integrated circuit). The term "underfill" refers to filling of the space between a substrate (e.g., a circuit board) and a subcomponent (e.g., an integrated circuit) with the protective polymer material. Complete underfilling without risk of damaging electrical connections is very desirable to protect an electrical device against damage due to mechanical shock or impact, even when the component is encapsulated or overmolded, and to protect against thermal cycling (e.g., temperature excursions in the range from about −60° C. to about 160° C.) and/or environmental exposure, even when the subcomponent is not encapsulated or overmolded. Overmolding, underfilling and encapsulation may be employed in combination or individually, and with the same or different polymers in one or multiple steps.

FIG. 1 shows a polymer underfilled and encapsulated electronic circuit board 10. Polymer overmolded electronic circuit board 10 includes a circuit board or substrate 12 having an electrical circuit formed on at least one surface thereof. Semiconductor chips 14, 16 are electrically connected to the electrical circuit on circuit board 12 such as by solder connections 18. Typical distances between the semiconductor chips 14, 16 and circuit board 12 are from about 10 micrometers to about 150 micrometers, and more typically from about 20 micrometer to about 100 micrometers. A space between the semi-conductor chips 14, 16 and the circuit board 12 defines underfill regions 20 that are desirably filled with a polymer overmolding 25. In order to fill the underfill regions 20, it is generally necessary to utilize a relatively low viscosity polymeric composition that is capable of filling these regions without placing excessive shear stresses on interconnections between the semi-conductor chips 14, 16 and circuit board 12.

In accordance with an aspect of this invention, improved rheology, and in particular reduced viscosity of the polymer overmolding material when it is flowing around features of the circuit board 12, semi-conductor chips 14, 16 and connections 18 is achieved by utilizing an overmolding composition comprising a synthetic resin matrix and inorganic filler particles substantially uniformly distributed in the matrix, wherein the particles have a platelet structure. As used herein, the expression "platelet structure" refers to a particle structure defined by opposite substantially flat and substantially parallel faces, the distance between the faces defining a thickness of the particles. The expression "substantially flat and substantially parallel faces" means that the thickness of the particle varies very little, typically less than the average thickness of the particle, and any deviation from flat and parallel, is minor, typically less than the average thickness of the particle. Desirably, the weight average ratio of surface area of a face of a particle to the thickness of the particle is at least 100, and preferably from about 200 to about 1000. The weight average ratio of surface area of a face of a particle to the thickness of the particle is determined by taking the sum of the products of the weight of each particle times the particular ratio of surface area to thickness for that particle, and dividing the sum by the total weight of all particles. Desirably, the particles have a thickness on the order of one nanometer ($10^{-9}$ meter), but may range from about one nanometer to several nanometers (e.g., 20 nm).

In addition to having the desired platelet geometry, the filler materials used in the preparation of polymer overmolded electrical devices in accordance with an aspect of this invention are inorganic platelet fillers that may be dispersed in a polymer matrix in a relatively small quantity to achieve a coefficient of thermal expansion for the cured or solidified polymer overmolding that is approximately the same as that of the circuit board and/or semi-conductor chips. In particular, it is desirable that the filler material be selected from inorganic filler materials having a platelet geometry and which may be uniformly dispersed in a synthetic resin matrix to achieve an overall coefficient of thermal expansion for the cured polymer overmolding that is in the range of from about 5 to about 20 ppm/° C. when the filler is added to the matrix in an amount of 20 percent or less by weight based on the weight of the resulting composite, and more desirably 15 percent or less by weight based on the weight of the composite.

Examples of filler materials that may be utilized in the polymer overmolding composition in order to achieve the desired rheology and thermal expansion properties include smectite clay minerals such as montmorillonite, nontronite, beidellite, volkonskoite, kectorite, saponite, sauconite, magadiite, kenyaite, vermiculite, and the like. Other suitable fillers include synthetic microscopic particles and/or nano-particles such as synthetic mica, fluorohectorites, etc.

The filler materials having a platelet structure may be advantageously employed in various synthetic resin matrixes to form a polymer overmolding composition that may be used in various conventional molding processes, including injection molding, reaction injection molding, resin transfer molding, etc. Examples include conventional thermosettable resins such as epoxy resins, phenolic resins, polyurethane resins, polyurea resins, cross-linkable RIM systems containing monomers such as styrene and cross-linkers such as divinyl benzene, and thermoplastic resins such as polyamides, copolyamides, polycarbonates, polyesters, copolyesters, etc.

The platelet particles typically have a thickness on the order of about 1 nanometer. Because of their molecular scale dimensions, the addition of small amounts of these platelet fillers to polymers can induce favorable increases in properties beyond simple additive rules. For example, substantial improvements in certain properties can be achieved with the addition of only small amounts (e.g., from about 5 to 10 weight percent) of the platelet particles. In addition to the desirable theological and thermal expansion properties described above, incorporation of the inorganic platetlet particles can provide a significant increase in the glass transition temperature ($T_g$) as manifested by an increase in heat deflexion temperature. This is of course advantageous. Reactivity in thermosetting systems decreases enormously as the glass transition temperature is approached and ceases at vitrification. Thus, use of the inorganic platelet filler particles facilitates formulation of a material with a low glass transition temperature, but which when fully cured has a heat deflexion temperature equivalent to that of a formulation having a higher glass transition temperature. Further, the inorganic platelet filler particles may provide efficient interstitial packing with reduced filler content and therefore lower viscosity. Inorganic platelet filler particles of a first type may be used in combination with one or more inorganic platelet filler particles of another type, and/or optionally with one or more other non-platelet filler particles. The use of inorganic platelet filler particles is also expected to impart greatly improved barrier resistance to diffusing molecules such as water and therefore may improve environmental durability of an overmolded electrical component.

In accordance with another aspect of the invention, it has been discovered that thermoplastic polymer materials may be used in an injection molding process (e.g., RIM) to encapsulate, overmold, and/or underfill electronic circuit board assemblies. Injection molding has several significant advantages over transfer molding, including increased speed or reduced cycle time. A particularly desirable process involves reaction injection molding (RIM) of a monomer or monomers that are capable of forming a thermoplastic polymer (e.g., polyesters or polyamides). Thermoplastic polymers are also lower cost and are easier to process as compared with thermosetting polymers such as epoxy resins. Thermoplastic materials are also generally tougher and less brittle than thermoset materials. Suitable thermoplastic materials that may be injection molded to encapsulate, overmold and/or underfill electronic circuit board assemblies and other electrical devices include, but are not limited to, polyamides, copolyamides, polyesters, copolyesters and polycarbonates.

In order to meet the thermal expansion requirements, the polymer may be in the form of a composite and may be filled with solid and/or hollow inorganic spheres (e.g., glass spheres), and/or the platelet filler materials having a nanoscopic dimension (as described above), such as those developed from montmorillonite smectite clays. The glass spheres may be composed of silica or an inorganic glass and typically have an average diameter of from about 1 to about 50 micrometers. Combinations of inorganic fillers may also be employed.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An overmolded electrical component, comprising:
a circuit board substrate having an electrical circuit;
a semi-conductor chip overlying the substrate and spaced apart therefrom by a distance of about 10 micrometers to about 150 micrometers, thereby creating a space between the circuit board substrate and the semi-conductor chip;
solder interconnections located within the space and connecting the electrical circuit to the semiconductor chip; and
a polymeric overmolding encapsulating the semi-conductor chip on the substrate and filling the space between the semi-conductor chip and the substrate about the solder interconnections, said polymeric overmolding being composed of a polymeric composite including a synthetic resin matrix and inorganic filler particles substantially uniformly distributed in the synthetic resin matrix, the inorganic filler particles having a platelet structure defined by opposite substantially flat and substantially parallel faces and being characterized by a dimensions between about 1 and 700 nanometers, the inorganic filler particle content being 20 percent or less by weight based on the weight of the polymeric composite.

2. The component of claim 1, wherein the electrical component is a substrate having an electrical circuit formed on at least one surface of the substrate and at least one semi-conductor chip electrically connected to the electrical circuit.

3. The component of claim 1, wherein the inorganic filler particle content is 15 percent or less by weight based on the weight of the polymeric composite.

4. The component of claim 1, wherein the inorganic filler particle is a smectite clay mineral.

5. The component of claim 4, wherein the smectite clay mineral is montmorillonite.

6. The component of claim 1, wherein the synthetic resin matrix is a thermoset resin.

7. The component of claim 6, wherein the thermoset resin is selected from epoxy, phenolic, polyurethane and polyurea resins.

8. The component of claim 1, wherein the synthetic resin matrix is a thermoplastic resin.

9. The component of claim 8, wherein the thermoplastic resin is selected from polyamides, copolyamides, polycarbonates, polyesters and copolyesters.

10. The component of claim 1, wherein the polymeric composite has a CTE from about 5 to 20 ppm/° C.

11. An overmolded electrical component, comprising:
a substrate having an electrical circuit;
a semi-conductor chip electrically connected to the substrate, the semi-conductor chip being spaced from the substrate by a distance of from about 10 micrometers to about 150 micrometers; and
a polymeric overmolding encasing the component and formed of a polymeric composite, said polymeric overmolding filling said space defined between the semiconductor chip and the substrate and overlying a surface of the component opposite the space;
wherein the polymer composite includes a synthetic resin matrix and inorganic filler particles substantially uniformly distributed in the synthetic resin matrix, the inorganic filler particles having a platelet structure defined by opposite substantially flat and substantially parallel faces and being characterized by a thickness between about 1 and 20 nanometers and a ratio of a surface area of a face to the thickness of at least 100, the inorganic filler particle content being 20% or less by weight based on the weight of the polymer composite.

* * * * *